(12) United States Patent
Krämer

(10) Patent No.: US 8,994,036 B2
(45) Date of Patent: Mar. 31, 2015

(54) SEMICONDUCTOR DEVICE WITH HEAT REMOVAL STRUCTURE AND RELATED PRODUCTION METHOD

(71) Applicant: Forschungsverbund Berlin E.V., Berlin (DE)

(72) Inventor: Tomas Krämer, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 44 days.

(21) Appl. No.: 13/864,353

(22) Filed: Apr. 17, 2013

(65) Prior Publication Data
US 2013/0270578 A1    Oct. 17, 2013

(30) Foreign Application Priority Data
Apr. 17, 2012   (DE) .......... 10 2012 206 289

(51) Int. Cl.
*H01L 23/373*    (2006.01)
*H01L 21/48*     (2006.01)
*H01L 23/367*    (2006.01)

(52) U.S. Cl.
CPC ........ *H01L 23/3738* (2013.01); *H01L 21/4871* (2013.01); *H01L 23/3732* (2013.01); *H01L 23/367* (2013.01); *H01L 23/3677* (2013.01); *H01L 2924/0002* (2013.01)
USPC .......................................................... 257/77

(58) Field of Classification Search
CPC .................................................. H01L 23/3677
USPC ............................................ 257/712, 717, 77
See application file for complete search history.

(56) References Cited

U.S. PATENT DOCUMENTS

| 5,792,677 | A  | * | 8/1998  | Reddy et al. ................. 438/122 |
| 7,286,359 | B2 |   | 10/2007 | Khbeis et al. |
| 2006/0205161 | A1 | | 9/2006 | Das et al. |
| 2007/0035011 | A1 | | 2/2007 | Hall et al. |

FOREIGN PATENT DOCUMENTS

DE    102008063416    7/2010

* cited by examiner

*Primary Examiner* — Mark Prenty

(57) ABSTRACT

According to the invention, a semiconductor device composite structure is provided which comprises an initial substrate with discrete, integrated devices and a heat removal structure. The heat removal structure comprises: a bond layer which is attached to the initial substrate or the devices, a heat removal structure which is attached on the bond layer and which consists of a material with a specific thermal conductivity which is at least double the level of the average specific heat conductivity of the initial substrate or the devices, and one or more metallic thermal bridges which thermally connect the devices with the heat removal structure via the bond layer. The thermal bridges are designed as vertical through connections (vias) through the bond and heat removal structure. The invention furthermore relates to an associated production method.

14 Claims, 3 Drawing Sheets

SEMICONDUCTOR DEVICE WITH HEAT REMOVAL STRUCTURE AND RELATED PRODUCTION METHOD

RELATED APPLICATION

This application claims the benefit of priority of German Patent Application No. 10 2012 206 289.0 filed Apr. 17, 2012, the contents of which are incorporated herein by reference in their entirety.

FIELD AND BACKGROUND OF THE INVENTION

A fundamental problem in semiconductor technology is that during the operation of integrated functional elements (device) such as transistors, semiconductor lasers or diodes, a not insignificant degree of thermal energy (also known as component heat) is generated. If the level of generated heat in the around the device exceeds a certain threshold value, this can lead to the general or abrupt degradation or destruction of the integrated device or even the entire circuit. With the growing need for greater output power, an ongoing trend towards miniaturising devices and increasing packing densities, the problem of unwanted heat development is growing in importance.

Several different approaches are known from the prior art which tackle the task, using different types of superstructures or layer sequences and layer structuring between semiconductor device layer structures, of transmitting the heat away from the integrated devices. Frequently, so-called heat distributors or, as an alternative or supplement, so-called heat sinks are used into which the discharge heat from the devices or more sensitive parts of the integrated circuit is transmitted.

Thus for example, an integrated circuit is known from U.S. Patent Publication No. 2007/0035011 A1 which comprises a plurality of electrical and thermal conducting "vias" (vertical interconnect accesses), to which an electrically insulating thermal conducting layer is "bonded" which enables heat removal without connecting the individual vias to each other. Here, the thermal conducting layer can for example be metallised or consist of a diamond layer.

A substrate for a circuit consisting of several layers is known from JP 2689986 B2, with which the thermal resistance of the substrate of a circuit is reduced, while at the same time, its capacity for transmitting heat can be increased. The substrate of the circuit which consists of several layers comprises an initial substrate which is based on a diamond layer, several contacting layers and diamond-based intermediate layers for electrical insulation.

A heat removal structure for a micro-electronic circuit is known from U.S. Pat. No. 7,286,359 B2, which comprises circuit elements which are arranged on an initial substrate, which comprise the areas which produce local heat which are thermally connected to a heat removal structure via feedthroughs which are fed through a thermally insulating layer.

Furthermore, a production method is known from U.S. Patent Publication No. 2006/0205161 A1 for a semiconductor device and semiconductor devices which comprise a plurality of source-gate-drain combinations which are designed for operation at high frequencies at a high output level, and in which measures or means for heat removal are provided.

DE 10 2008 063 416 A1 discloses a semiconductor device with a substrate, wherein a semiconductor layer is formed over the substrate which represents any suitable semiconductor material in order to produce circuit elements inside and above it which are arranged on a component level. Within the semiconductor device lies a buried insulating layer which separates the component level from the substrate. For the purpose of heat removal in the areas of the semiconductor device where temperature is a critical factor, in DE 10 2008 063 416 A1, openings or pits are etched over the entire height of the semiconductor device, which are filled with a filling material. The filling material then forms a heat removal element for each opening. Furthermore, a material plug can be arranged at the lower end of each opening in order to encase the filling material.

SUMMARY OF THE INVENTION

The present invention relates to a heat removal structure for electrically, discrete integrated semiconductor devices, together with a related production method.

According to the invention, a semiconductor device composite structure is provided which comprises an initial substrate with, discrete integrated devices and a heat removal structure. The heat removal structure comprises a bond layer which is attached to the initial substrate or the devices, a heat removal structure which is attached on the bond layer and which consists of a material with a specific thermal conductivity which is at least double the level of the average specific heat conductivity of the initial substrate or the devices, and one or more metallic thermal bridges which thermally connect the devices with the heat removal structure via the bond layer.

The thermal bridges are designed as vertical through connections (vias) through the bond and heat removal structure. An embodiment of this type can be produced in a particularly simple manner, since in order to realise the thermal bridges, no particular or complex structures must be created, and thus, methods for creating through connections which are standardised in the field of semiconductor technology can be used.

According to the prior art, one would anticipate that the layer structure described above, which includes a bond layer which is a poor heat conductor as an essential element of the heat removal structure, would be unsuitable for sufficient removal of the component heat, and thus for solving the problem of heat development presented above. Contrary to expectations, it has been shown that through the combination of a bond layer with poor heat conduction and a heat removal structure with good heat conduction, together with the installation of discrete thermal bridges which essentially thermally connect the integrated devices with the heat removal structure, a removal of the component heat can be achieved in an advantageous manner in comparison with the prior art. Here, the lateral through structuring of the bond medium with vertical thermal bridges through a functional separation enables simultaneous optimisation of both the bonded composite structure composition of the device with the heat removal structure as well as of the heat transfer outwards via the bond medium. Here, the advantage results on the one hand from the direct, highly space-saving and discrete connection of the devices to the heat removal structure, while on the other, from their ability to separately transmit large heat quantities from the individual devices. The thermal bridges can here also be realised and used as connections for the purpose of discrete electrical contacting of the integrated devices. The heat removal structure itself is usually designed as an approximately planer layer in relation to the dimensions of the devices, which aside from the contact holes for the through connections (vias) or thermal bridges, preferably comprises a low lateral structure in order to prevent restriction of the spread of heat within the heat removal structure to an unnecessary degree. The composite of the devices and heat removal structure is easy to process and is suitable for mass production. This applied in particular to the heat removal structure itself, the production of the composite via the bond medium and to the establishment of the separate thermal vias from the devices to the heat sink.

During the course of production, which can take place for each element in parallel as part of a "wafer level packaging" system, with one possible production variant, the initial substrate with the integrated devices is covered over the entire surface, i.e. over the entire wafer, with a bond layer. The entire wafer is then connected, for example adhered, via the bond layer with a heat removal structure which is attached as an option to a carrier substrate.

The carrier substrate, if present, is removed and the bond layer and heat removal structure are structured. The aim is to achieve a high degree of specific heat conductivity of the heat removal structure, which with the given thermal standards is reflected in reduced material thicknesses and thus a lower vias topology. Together with its good structurability, completion of the process within fully developed, established methods for semiconductor chip production (front end) can be provided which guarantee parallel processing of the devices with simultaneous high alignment precision (<2 µm), resolution (<5 µm) and form stability (<1 µm) as are required for high integration densities and for hyperfrequency applications.

Together with the vias process, the heat removal layers can be individually separated from each other, i.e. using a free separation line with high precision edges, compared to the straight-lined sawing line method which is otherwise used as a standard. With the simultaneous separation of the semiconductor chips with correspondingly high precision edges, very short micro-strip bridge structures of just a few tens of micrometers and a structural resolution of several micrometers provide almost seamless electrical transfers beyond chip boundaries, even at operating frequencies of >100 GHz.

The bond layer is directly attached, or is preferably attached via an adhesion promoter layer, to the initial substrate or devices.

Preferably, the specific heat conductivity of the heat removal structure is at least three times as high as the average specific heat conductivity of the initial substrate, in particular of the semiconductor layers of the device. A realisation of this type increases the capacity for heat conduction of the heat removal structure, and enables the removal of large heat quantities as can occur in output devices such as diode lasers or output transistors, or with densely packed devices such as those in integrated circuits.

In one preferred embodiment, the specific heat conductivity of the heat removal structure is $\geq 250$ $Wm^{-1}K^{-1}$. In particular, the heat removal structure consists in parts or completely of carbon with a diamond structure (for example as described in US 2007/0035011 A1 and JP 2689986 B2) or silicon carbide (SiC).

Preferably, the heat removal structure comprises a layer thickness ranging from 1 µm to 1000 µm, in particular 5 to 20 µm.

In one preferred embodiment, the heat removal structure consists in part or completely of carbon with a diamond structure. Materials of this type have a high degree of heat conductivity, can be well structured with dry chemistry and can be advantageously realised as a layer, for example using the chemical vapour deposition method (CVD). The low level of materials required by the diamond layer, which is needed in order to meet thermal and mechanical requirements, leads to low vias topologies, which together with their good structurability enable processing within established semiconductor production methods.

Preferably, the bond layer comprises a layer thickness ranging from 50 nm to 50 µm, in particular 1 to 3 µm. The advantage of such a design is the compact structure which it enables, which results in savings in costs, processing time and space. With shorter thermal bridges, the heat resistance between the device and the heat removal structure is also reduced alongside the vias topology.

In one preferred embodiment, the bond layer comprises a specific heat conductivity of $\leq 5$ $Wm^{-1}K^{-1}$. The bond layer itself should absorb as little heat as possible, since it lies directly on the integrated devices and functions as a thermal insulation between the devices and the heat sink.

Preferably, the bond layer consists of an organic polymer. Organic polymers can easily be separated in a defined thickness using methods with a low degree of complexity, such as spin coating. Organic polymers are also particularly suited for wafer bonding.

In one preferred embodiment, the bond layer consists of a polymer based on benzocyclobutene (BCB). BCB is particularly suitable for wafer bonding and is used to form a robust connection between the heat removal structure and the substrate with the integrated devices (specific heat conductivity BCB=0.3 $Wm^{-1}K^{-1}$).

In one preferred embodiment, the thermal bridges consist of a metal or alloy, the specific heat conductivity of which is $\geq 200$ $Wm^{-1}K^{-1}$ such as gold, copper or aluminium.

Particularly preferred is a combination of a heat removal structure which consists of carbon with a diamond structure or silicon carbide, with a bond layer consisting of benzocyclobutene (BCB) and with thermal bridges in the embodiment described above. A combination of materials of this nature enables the efficient removal of very large heat quantities. An advantageous ratio between the heat removal and the realised mechanical carrier volume can also be achieved. Compared to other connections, the connection of the heat removal structure to the substrate via the BCB wafer bonding and via the metallic, particularly galvanic, head bridges, provides a robust connection technology. The structure of a semiconductor device layer structure in the embodiment described above is here high and hyperfrequency-compatible in the entire millimeter wave range. The dielectric loss factor (also known as tangent delta loss) of the semiconductor device layer structure is very low in the embodiment described above.

Preferably, the heat removal structure is arranged on both sides of the devices. Due to a sandwich structure of this nature, the transmission of the heat from the devices to the heat removal structure is further improved, since the thermal bridges transport the component heat away from both the front as well as the rear side of the devices and towards the heat removal structures. Below, the front side of the devices is defined as the side of the devices facing away from the initial substrate, while the rear side is the opposite side of the devices which faces towards the substrate.

In one further preferred embodiment, the base area of a thermal bridge covers at least 40% of the respective front surface of a device.

A further aspect of the invention lies in the provision of a method for producing the semiconductor device composite structure described above. The method comprises the steps of:

applying a bond layer to the initial substrate or to the devices;

applying a heat removal structure to the bond layer, wherein the heat removal structure consists of a material with at least double the specific heat conductivity of the average specific heat conductivity of the initial substrate or devices; and providing one or more metallic thermal bridges which thermally connect the devices with the heat removal structure via the bond layer, wherein the thermal bridges are designed as vertical through connections (vias) through the bond and heat removal structure.

BRIEF DESCRIPTION OF THE DRAWINGS

Exemplary embodiments of the invention will now be explained in greater detail with reference to the drawings and the following description.

In the drawings.

DESCRIPTION OF SPECIFIC EMBODIMENTS OF THE INVENTION

Figure 1:
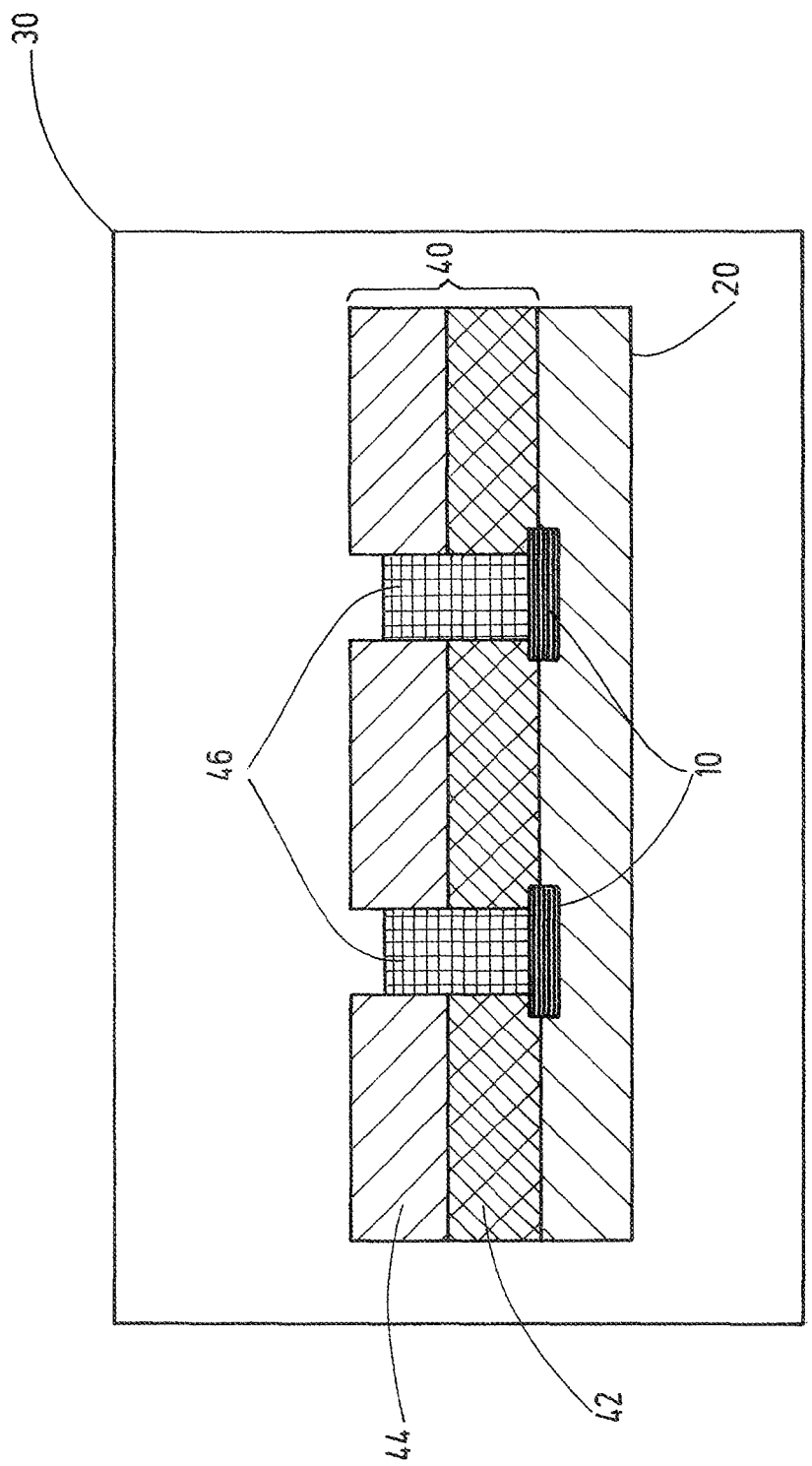
FIG. 1 shows a principle structure of an embodiment of the semiconductor device composite structure according to the invention with heat removal structure.

FIG. 1 shows the principle structure of an embodiment of the semiconductor device composite structure according to the invention with heat removal structure 30. On the front side of the initial substrate 20 with discrete devices 10, a bond layer 42 is applied. The bond layer 42 can be directly applied or is preferably applied via an adhesion promoter layer (not shown) to the initial substrate 20 or to the devices 10. A heat removal layer 44 is located directly on the bond layer 42. In order to connect the heat removal layer 44 to the discrete devices 10, several, in FIG. 1, two, thermal bridges 46 are established. In order to implement them, initially, hollow vias or contact holes are created which are fed through the heat removal layer 44 and the bond layer 42 and extend to the integrated devices 10. Then, the hollow vias are filled with material from the surface of the integrated devices 10 until preferably beyond half the thickness of the heat removal layer 44. The thermal bridges 46 are thus in thermal contact with the integrated devices 10 and the heat removal layer 44. In this manner, the heat removal layer 44 is thermally connected to the integrated devices 10 via the shortest route through the bond layer 42. If thermal energy is generated during operation of the integrated devices 10, it is transferred via the thermal bridges 46 to the heat removal layer 44 which functions as a heat spreader.

The bond layer 42 can consist of polymerised benzocyclobutene and the heat removal layer 44 can consist of CVD diamond or silicon carbide. Gold, copper or aluminium are particularly suitable for the thermal bridges 46.

Figure 2:
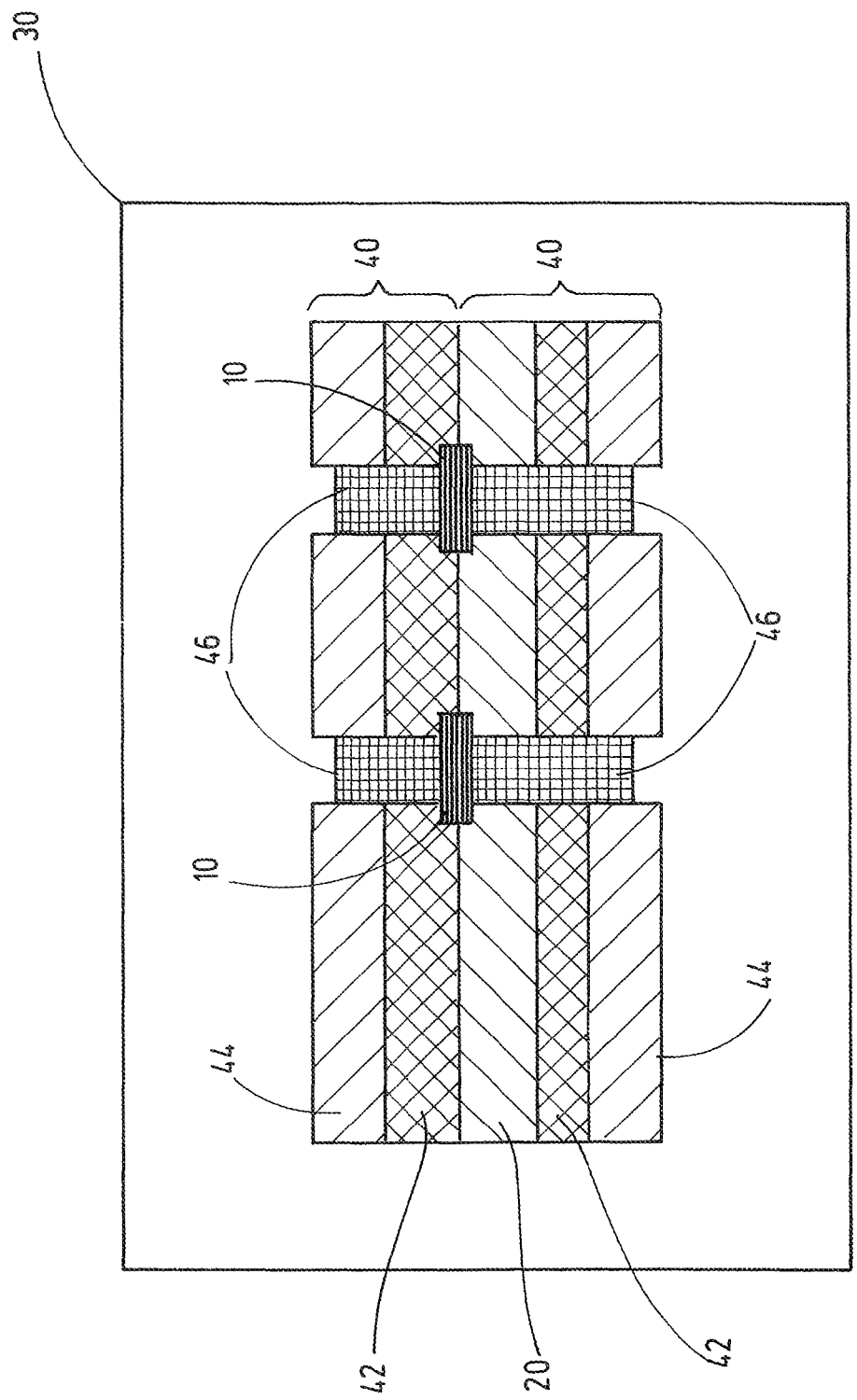
FIG. 2 shows a principle structure of a semiconductor device composite structure according to the invention with which the heat removal structure is applied on both sides of the devices.

FIG. 2 shows the principle structure of a semiconductor device composite structure according to the invention with a heat removal structure 30 in which the heat removal structures 40 are provided on both sides of the initial substrate 20. A heat removal structure 40 of this type is also known as a sandwich structure. In the specific embodiment shown in FIG. 2, a bond layer 42 is applied to both sides of the devices, i.e. in relation to the front and rear side of the initial substrate 20. One heat removal layer 44 is located on each of the two bond layers 42. In this specific exemplary embodiment, the front sides of the discrete devices 10 are thermally connected via thermal bridges 46 with the heat removal layer 44, while the rear sides of the discrete devices 10 are connected via metallic thermal bridges 46 with the heat removal layer 44 through the initial substrate. As an option, during the course of the process, the initial substrate 20 can also be completely removed, or instead of the device 10, only the rear side of the initial substrate 20 can be thermally in contact with the thermal bridge 46. The metallic thermal bridges 46 to the front side of the devices are in the example shown in FIG. 2 implemented as vertical through connections (vias) by the bond and heat removal structure 42, 44, while the thermal bridges 46 to the rear side of the devices also run through the initial substrate 20. They are formed by a material which in this exemplary embodiment protrudes from the surface of the integrated devices 10 and is in thermal contact with the material of the heat removal layer 44. In this manner, the integrated device 10 is connected on both sides to one heat removal layer 44 respectively.

Figure 3:
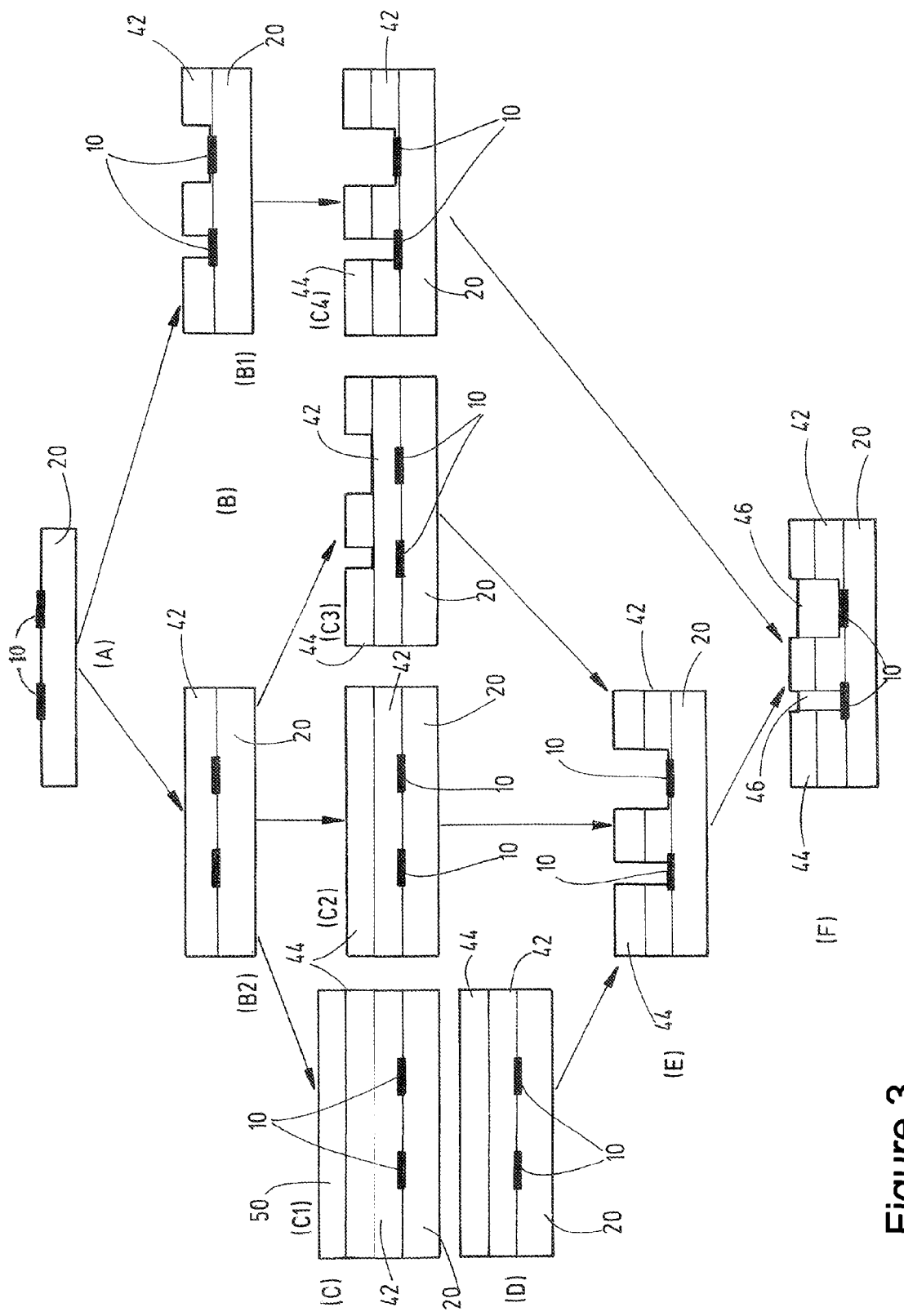
FIG. 3 shows several production variants of a semiconductor device composite structure according to the invention with a heat removal structure.

FIG. 3 shows several specific production variants of a semiconductor device composite structure 30 according to the invention. These production variants present alternatives to each other. Here, the starting point of all production variants is the initial substrate 20 with the integrated devices 10 (step A).

This initial substrate 20 can for example consist of silicon or a III-V semiconductor and comprise specially dosed areas. Initially, the bond layer 42 is applied to the front side of the initial substrate 20, for example using the so-called spin coating method (step B). The bond layer can for example be a layer made of polymerised benzocyclobutene, which has a thickness of between 50 nm and 50 µm. Then, either the bond layer 42 is pre-structured by uncovering the integrated devices 10, at least partially, (step B1), or the bond layer remains initially unstructured (step B2) and in a second production variant, the process is begun of applying the heat removal layer 44 and if required, pre-structuring it (step C).

The heat removal layer 44 in particular has a thickness of between 1 and 1000 µm and for example consists entirely of carbon which comprises a diamond structure. This can occur in several ways: In a first production variant, the heat removal layer 44 is initially applied to a carrier substrate 50, then connected to the bond layer 42 and is initially not further treated (step C1). In a second production variant, the heat removal layer 44 is directly applied to the bond layer 42 without a carrier substrate 50, and also initially remains untreated (step C2). In a third production variant, the heat removal layer 44 is applied and pre-structured with or without carrier substrate to the bond layer 42, wherein the bond layer initially remains essentially untouched (step C3). In a fourth production variant, the heat removal layer 44 is applied with or without carrier substrate to the already pre-structured bond layer 42 and is structured in accord with the bond layer. Regardless of whether or not a carrier substrate 50 is used, with step C, adhesion promoter layers can also be used which are not shown in FIG. 3.

If a carrier substrate 50 has been used, it is removed after completion of the bonding process (step D). After the structuring implemented in step C has been completed, the contact holes for the thermal bridges are made. After steps D, C2 and C3 have been completed, this has not yet been (entirely) implemented, and is conducted in a step E. In this case, the contact holes for the thermal bridges are etched anisotropically and selectively. Then, the contact holes are filled with material, in this case beyond the thickness of the bond layer 42 and half the thickness of the heat removal layer 44 (step F). The material which forms the thermal bridges is therefore in thermal contact both with the integrated devices 10 and with the heat removal layer 44. In this exemplary embodiment, it consists of gold.

When the thermal bridges 46 have been installed, the production method for generating a sandwich structure, i.e. for generating a second heat removal structure 40 on the rear side of the device 10, as shown in FIG. 2, can be repeated. A second heat removal layer 44 can as an option be directly applied to the rear side of the initial substrate 20.

What is claimed is:

1. A semiconductor device composite structure which comprises an initial substrate with discrete, integrated device components and a heat removal structure, wherein the heat removal structure comprises:
   a bond layer which is applied to the initial substrate or to the devices;
   a heat removal layer which is applied to the bond layer, and consists of a material with at least double the specific heat conductivity of the average specific heat conductivity of the initial substrate or the devices; and
   one or more metallic thermal bridges which thermally connect the devices with the heat removal layer via the bond layer, characterized in that the thermal bridges are designed as vertical through connections (vias) through the bond and heat removal layers.

2. The semiconductor device composite structure according to claim 1, wherein the bond layer is applied to the initial substrate using an adhesion promoter layer.

3. The semiconductor device composite structure according to claim 1, wherein the specific heat conductivity of the heat removal layer is at least three times as high as the average specific heat conductivity of the initial substrate.

4. The semiconductor device composite structure according claim 1, wherein the average specific heat conductivity of the heat removal layer is ≥250 Wm−1K−1.

5. The semiconductor device composite structure according to claim 1, wherein the heat removal layer has a layer thickness ranging from 1 μm to 1000 μm.

6. The semiconductor device composite structure according to claim 1, wherein the heat removal layer partly or entirely consists of carbon with a diamond structure or silicon carbide.

7. The semiconductor device composite structure according to claim 1, wherein the bond layer has a layer thickness ranging from 50 nm to 50 μm.

8. The semiconductor device composite structure according to claim 1, wherein the bond layer has a specific heat conductivity of ≤5 Wm−1K−1.

9. The semiconductor device composite structure according to claim 1, wherein the bond layer consists of an organic polymer.

10. The semiconductor device composite structure according to claim 9, wherein the bond layer consists of a polymer based on benzocyclobutene.

11. The semiconductor device composite structure according to claim 1, wherein the thermal bridges consist of a metal or alloy, the specific heat conductivity of which is ≥200 Wm−1K−1.

12. The semiconductor device composite structure according to claim 11, wherein the thermal bridges consist of gold, copper or aluminium.

13. The semiconductor device composite structure according to claim 1, wherein the heat removal structure is arranged on both sides of the devices on their front and rear side in relation to the initial substrate.

14. The semiconductor device composite structure according to claim 1, wherein the base area of a metallic thermal bridge covers at least 40% of the respective front surface of a device.

* * * * *